(12) United States Patent
Ben-David (10) Patent No.: US 7,155,374 B2
(45) Date of Patent: Dec. 26, 2006

(54) GENERATION OF PARTIAL TRACES IN MODEL CHECKING

(75) Inventor: Shoham Ben-David, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 940 days.

(21) Appl. No.: 10/042,294

(22) Filed: Jan. 11, 2002

(65) Prior Publication Data

US 2003/0004926 A1 Jan. 2, 2003

Related U.S. Application Data

(60) Provisional application No. 60/261,550, filed on Jan. 12, 2001.

(51) Int. Cl.
*G06F 17/10* (2006.01)
(52) U.S. Cl. .................... 703/2; 716/4; 714/25; 703/14
(58) Field of Classification Search ................ 703/2
See application file for complete search history.

(56) References Cited

OTHER PUBLICATIONS

Bruegge, Bernd; Hibbard, Peter; "Generalized Path Expressions: A High Level Debugging Mechanism", Mar. 1983, Proceedings of the symposium on High-level debugging, vol. 8, 18 Issue 4.*
Ball, Thomas; Larus, James R.; "Optimally Profiling and Tracing Programs", ACM Transactions on Programming Languages and Systems (TOPLAS), Jul. 1994, vol. 16 Issue 4.*
Kidd, Marie-Elena C.; "Ensuring critical event sequences in high consequence computer based systems as inspired by path expressions", International Conference and Workshop on Engineering of Computer-Based Systems, 1997, Proceedings, Mar. 24-28, 1997.*
E. Clarke Jr. et al., "Model Checking", Chapter 1, MIT Press, 1999, pp. 4-6.
K. McMillan, *Symbolic Model Checking*, Kluwer Academic Publishers, Chapter 2, pp. 11-12, 1993, Norwell, Massachusetts.
E.M. Clarke et al., "Efficient Generation of Counterexamples and Witnesses in Symbolic Model Checking", 32$^{nd}$ Design Automation Conference, 1995, pp. 427-432.
Ilan Beer et al., "Rule Base: An Industry-Oriented Formal Verification Tool", Proceedings of the Design Automation Conference DAC'96, Las Vegas, Nevada, 1996.
Ilan Beer et al., "On-The-Fly Model Checking of RCTL Formulas", Proceedings of the Tenth International Conference on Computer Aided Verification (CAV 1998).

(Continued)

*Primary Examiner*—Paul L. Rodriguez
*Assistant Examiner*—Russ Guill
(74) *Attorney, Agent, or Firm*—Browdy and Neimark, PLLC (57) ABSTRACT

A method for checking a model includes specifying a path to be traversed through the states of a system under study, such that a specified sequence of events is to occur on the specified path between an initial state and a target set of states on the path. Beginning from the initial state, successive reachable sets of states along the specified path are computed, such that in the successive reachable sets the events occur in the specified sequence. When an intersection is not found to exist between one of the reachable sets on the specified path and the target set, a partial trace is produced along the specified path between the initial state and a termination state in which at least one of the specified events occurs.

51 Claims, 3 Drawing Sheets

OTHER PUBLICATIONS

Ilan Beer et al., "The Temporal Logic Sugar", Proceedings of the Thirteenth International Conference on Computer Aided Verification (CAV 2001).

Randal E. Bryant, "Graph-Based Algorithms for Boolean Function Manipulation", IEEE Transactions on Computers C-35:8, 1986.

U.S. Appl. No. 09/367,720, entitled "Target Design Model Behavior Explorer", filed Jul. 29, 1999.

U.S. Appl. No. 60/261,550, entitled: "PathFinder: Design Exploration Through Model Checking", filed Jan. 12, 2001.

* cited by examiner

GENERATION OF PARTIAL TRACES IN MODEL CHECKING

CROSS-REFERENCE TO RELATED APPLICATIONS

This application claims the benefit of U.S. Provisional Patent Application No. 60/261,550, filed Jan. 12, 2001. It is related to U.S. patent application Ser. No. 09/367,720, filed Jul. 29, 1999, as well as to another U.S. patent application, filed on even date, entitled "Time-Memory Tradeoff Control in Counterexample Production." All of these related applications are assigned to the assignee of the present patent application and are incorporated herein by reference.

FIELD OF THE INVENTION

The present invention relates generally to design automation and verification, and specifically to design exploration and verification based on symbolic model checking.

BACKGROUND OF THE INVENTION

Model checking is a method of formal verification that is gaining in popularity as a tool for use in designing complex systems, such as integrated circuits. The method is described generally by Clarke et al. in *Model Checking* (MIT Press, 1999), which is incorporated herein by reference.

To perform model checking of the design of a device, a user reads the definition and functional specifications of the device and then, based on this information, writes a set of properties $\{\phi\}$ (also known as a specification) that the design is expected to fulfill. The properties are written in a suitable specification language for expressing temporal logic relationships between the inputs and outputs of the device. Such languages are commonly based on Computation Tree Logic (CTL). A hardware model M (also known as an implementation) of the design, which is typically written in a hardware description language, such as VHDL or Verilog, is then tested to ascertain that the model satisfies all of the properties in the set, i.e., that $M \models \phi$, under all relevant input sequences. Such testing is a form of reachability analysis.

One of the most useful features of model checking is its ability, when a property $\phi$ is found to be false on M, to construct a sequence of states and transitions (a path) that leads to the problematic state of the design. This path is called a counterexample. It can be used by the engineer in understanding and remedying the design defect that led to the failure of the model.

Model checking is typically carried out automatically using a symbolic model checking program, such as SMV, as described, for example, by McMillan in *Symbolic Model Checking* (Kluwer Academic Publishers, 1993), which is incorporated herein by reference. A number of practical model checking tools are available, among them RuleBase, developed by IBM Corporation. This tool is described by Beer et al. in "RuleBase: an Industry-Oriented Formal Verification Tool," in *Proceedings of the Design Automation Conference DAC'96* (Las Vegas, Nev., 1996), which is incorporated herein by reference.

Symbolic CTL model checking as described by McMillan involves computing the transition-relation (TR) of the model, and then applying the model checking algorithm to verify a specified formula. In many cases, the full TR is too big to be computed. This problem is addressed by Beer et al., in "On-the-fly Model Checking of RCTL Formulas," *Proceedings of the Tenth International Conference on Computer Aided Verification* (CAV 1998), which is incorporated here in by reference. In this paper, the authors describe a technique for solving CTL formulas of the form AG(p), wherein p is a Boolean expression. An AG(p) formula states that p is true in every reachable state of the model. Therefore, to disprove this formula, it is sufficient to find one reachable state in which p is false. In the context of the present patent application and in the claims, such a state is referred to as a target state. It may also be called a "bad" state, as it violates the specified formula.

If S is the set of states in which p is false, then in order to find a "bad" state, it is necessary only to intersect S with the set of reachable states R of the model, and check that the intersection is not empty. Finding this intersection is computationally easy, and therefore can be performed on the fly, i.e., after each iteration of the reachability analysis. If the intersection of S and R is found at any point to be non-empty, the process is stopped, and AG(p) is false. Otherwise, the process continues and terminates when the entire reachable state space has been computed, so that AG(p) is shown to be true. Thus, this method eliminates the large expenditure of computation resources needed to compute the full transition relation. Furthermore, since counterexamples are produced as soon as the target state is found, only a portion of the reachable state space must be computed when the formula fails, saving even more time and memory space.

The on-the-fly model checking procedure is shown formally in Table I below:

TABLE I

| | ON-THE-FLY MODEL CHECKING |
|---|---|
| 1 | reachable = new = initialStates; |
| 2 | i = 0; |
| 3 | while ((new ≠ ∅)&&(new ∩ p = ∅)) { |
| 4 | $S_i$ = new; |
| 5 | i = i+1; |
| 6 | next = nextStateImage (new) |
| 7 | new = next \ reachable; |
| 8 | reachable = reachable ∪ next; |
| 9 | } |
| 10 | if (new = ∅) { |
| 11 | print "formula is true in the model"; |
| 12 | return; |
| 13 | } |

Here the "&&" operator represents logical conjunction, and the function "nextStateImage(new)" returns the states that are reached in one cycle of the system transition relation beginning from the states in {new}.

If it is found at any cycle of the above process that new ∩φp≠∅, the model checker informs the user that the formula AG(p) is false for the model in question. Typically, the model checker goes on to compute a counterexample, by finding a trace back through the state space from one of the states in the intersection region {new ∩φp} to one of the initial states. A similar procedure can be used to find a "witness," or positive example, demonstrating fulfillment of a formula EF(p). This latter formula states that there exists some path through the state space of the model to some state on which p is true. It is the dual of AG(φp). In this case, the target states are those in which p is true.

In the above-mentioned article, Beer et al. describe a technique for translating many CTL formulas conveniently into state machines having an error state. Such formulas can then be verified by on-the-fly model checking of the formula AG(φerror). The authors also define a specification language RCTL, as an extension to the conventional CTL language using regular expressions. More recently, Beer et al. have extended RCTL to include further expressions and syntax that are useful in creating formulas for on-the-fly model checking, as described in "The Temporal Logic Sugar," *Proceedings of the Thirteenth International Conference on Computer Aided Verification* (CAV 2001), which is incorporated here in by reference.

SUMMARY OF THE INVENTION

As described above, model checkers known in the art trace and return a counterexample (or witness) only if their state space exploration finds a reachable target state. In preferred embodiments of the present invention, however, a novel model checker generates a partial trace even when it has found no reachable target states. The partial trace reflects a path through the state space that approaches the target states, even if it does not succeed in reaching them. Preferably, the model checker generates a maximal partial trace, i.e., a trace that most closely approaches the target states among the traces that can be produced in the reachable state space of the model. Such partial traces provide the user with helpful insight into the behavior of the system under study.

Model checkers in accordance with preferred embodiments of the present invention are particularly useful in the context of design exploration, as described, for example, in the above-mentioned U.S. patent application Ser. No. 09/367,720. In the exploration paradigm, instead of seeking errors in finished designs, the model checker assists the user in understanding the operation of his or her design during the development phase. The exploration tool is given a model M and a path specification P. It then applies model checking to find a path that conforms to the path specification. In preferred embodiments of the present invention, the tool finds a witness—a full trace that conforms to the full path specification, if such a path exists in the reachable state space, or a partial trace if not. The user can then analyze the trace to decide whether the model behaves as it should.

Preferably, the path specification is input to the model checker as a sequence of events (which do not necessarily occur on consecutive cycles of the system under study). Typically, each event corresponds to a Boolean expression over the set of state variables. The event is considered to have occurred when the corresponding expression is true. The model checker uses techniques of on-the-fly model checking to find a path through the reachable state space on which all the events occur in the order given by the specification, as it proceeds to explore the state space of the system. Most preferably, the model checker returns a progress indication to the user each time it finds that there is a path that reaches the next event in the sequence. If and when the model checker succeeds in finding a complete path, on which all the events occur in the proper sequence, it returns that trace. Even when no complete path is found, however, the model checker returns a partial trace, on which the largest possible number of the specified events occur in the proper sequence.

There is therefore provided, in accordance with a preferred embodiment of the present invention, a method for checking a model, which defines states of a system under study and a transition relation among the states, the method including:

specifying a path to be traversed through the states of the system under study from an initial set that includes at least one initial state among the states of the system to a target set that includes at least one target state among the states of the system, such that a specified sequence of events is to occur on the specified path between the at least one initial state and the at least one target state;

beginning from the initial set, computing successive reachable sets including the states of the system that are reachable from the initial set along the specified path, such that in the successive reachable sets the events occur in the specified sequence;

determining whether an intersection exists between one of the reachable sets on the specified path and the target set; and when the intersection is not found to exist, producing a partial trace along the specified path between the at least one initial state and a termination state in which at least one of the specified events occurs.

Preferably, specifying the path includes defining the events in terms of transitions among the states of the system under study. Typically, defining the events includes defining the transitions such that in the sequence of events, at least two consecutive transitions are separated by more than one cycle of the transition relation. Additionally or alternatively, computing the successive reachable sets includes building a non-deterministic automaton based on the transitions, and computing the reachable sets using the automaton. Preferably, building the non-deterministic automaton includes defining Boolean conditions corresponding respectively to the transitions, and detecting the occurrence of the events includes testing the Boolean conditions.

Preferably, computing the successive reachable sets includes detecting occurrence of the events in the sequence and informing a user upon detecting occurrence of the events. Additionally or alternatively, producing the partial trace includes choosing the termination state to be one of the states in which a final event occurs in the sequence of the events whose occurrence has been detected.

Preferably, computing the successive reachable sets includes determining a first set among the reachable sets, disjoint from the initial set, such that all of the states in the first set are reached from the initial states in a first cycle of the transition relation, and determining the successive reachable sets, following the first set, such that all the states in each of the sets are reached from the states in the preceding set in a successive cycle of the transition relation, and so that each of the sets is disjoint from the initial set and from the other sets determined before it. Further preferably, producing the partial trace includes selecting one of the states from each of at least some of the successive reachable sets. Most preferably, selecting the one of the states includes, for each of the selected states, choosing a predecessor state among the states in the preceding set until the state on the trace in the first set is found, and choosing, in the initial set, the predecessor state to the state in the first set.

Preferably, when it is determined that the intersection exists between the target set and one of the reachable sets, the method includes producing a complete trace from the at least one target state through the states in the reachable sets to the at least one initial state. Most preferably, producing the complete trace includes computing the trace so that all the events occur along the trace in the specified sequence.

Typically, specifying the path includes specifying a property to be fulfilled by the at last one target state. Preferably, specifying the property includes specifying a condition that is expected to be true over all of the reachable states of the system under study, wherein the condition is false in the at least one target state. Alternatively, specifying the property includes specifying a condition representing a desired behavior of the system under study, such that the condition is fulfilled in the at least one target state. Most preferably, computing the successive reachable sets includes testing the property while computing the sets, and ceasing to compute the sets when the intersection is found to exist.

There is also provided, in accordance with a preferred embodiment of the present invention, model checking apparatus, including a model processor, which is arranged to receive a model that defines states of a system under study and a transition relation among the states, and to receive a specification of a path to be traversed through the states of the system under study from an initial set that includes at least one initial state among the states of the system to a target set that includes at least one target state among the states of the system, such that a specified sequence of events is to occur on the path between the at least one initial state and the at least one target state, the processor being further arranged to compute, beginning from the initial set, successive reachable sets including the states of the system that are reachable from the initial set along the path, such that in the successive reachable sets the events occur in the specified sequence, and to determine whether an intersection exists between one of the reachable sets on the path and the target set, and when the intersection is not found to exist, to produce a partial trace along the specified path between the at least one initial state and a termination state in which at least one of the specified events occurs.

There is additionally provided, in accordance with a preferred embodiment of the present invention, a computer software product, including a computer-readable medium in which program instructions are stored, which instructions, when read by a computer, cause the computer to receive a model that defines states of a system under study and a transition relation among the states, and to receive a specification of a path to be traversed through the states of the system under study from an initial set that includes at least one initial state among the states of the system to a target set that includes at least one target state among the states of the system, such that a specified sequence of events is to occur on the path between the at least one initial state and the at least one target state, and which cause the computer to compute, beginning from the initial set, successive reachable sets including the states of the system that are reachable from the initial set along the path, such that in the successive reachable sets the events occur in the specified sequence, and to determine whether an intersection exists between one of the reachable sets on the path and the target set, and when the intersection is not found to exist, to produce a partial trace along the specified path between the at least one initial state and a termination state in which at least one of the specified events occurs.

The present invention will be more fully understood from the following detailed description of the preferred embodiments thereof, taken together with the drawings in which:

DETAILED DESCRIPTION OF PREFERRED EMBODIMENTS

Figure 1:
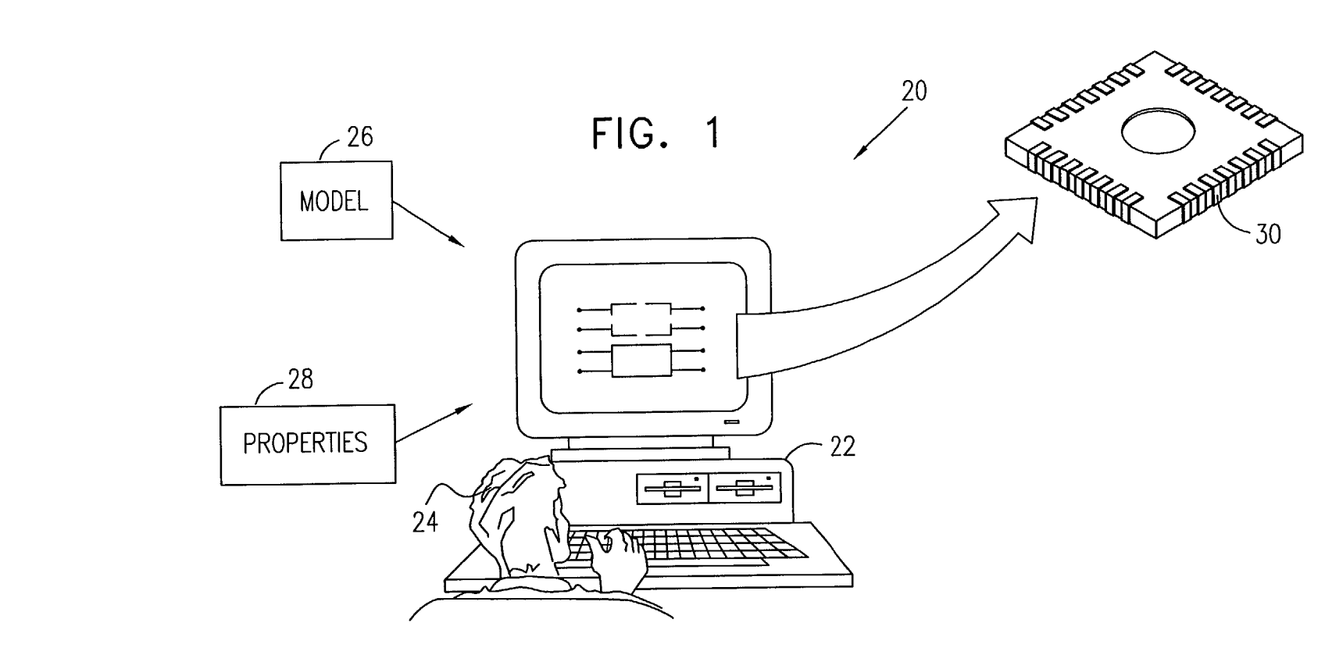
FIG. 1 is a schematic, pictorial illustration showing a system for design exploration, in accordance with a preferred embodiment of the present invention.

FIG. 1 is a schematic pictorial illustration of a system 20 for symbolic model checking, in accordance with a preferred embodiment of the present invention. System 20 typically comprises a model processor 22, typically a general-purpose computer workstation running suitable model checking software. The system is operated by a user 24, typically a design or verification engineer. The model checking software may be downloaded to processor 22 in electronic form, over a network, for example, or it may be supplied on tangible media, such as CD-ROM or non-volatile memory. Processor 22 receives a hardware implementation model 26 of a target system or device 30 in development, which may refer to the entire system or device or to a sub-unit, such as a circuit or functional block. User 24 prepares a path specification 28, comprising properties for use in model checking of model 26, and selects initial states of the model. System 20 analyzes the model, using methods described in detail hereinbelow, to find full or partial traces between the initial states and target states, which are inferred by processor 22 based on the path specification.

Figure 2:
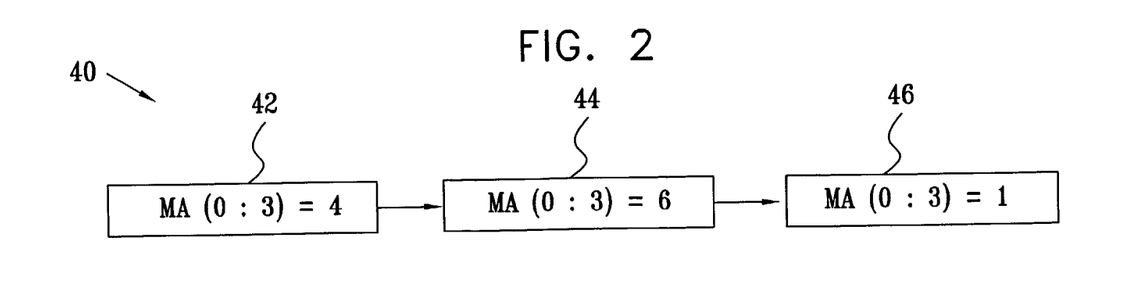
FIG. 2 is a block diagram that schematically illustrates a path specification of a system under study.

FIG. 2 is a block diagram that schematically illustrates a path specification with respect to a state machine 40, "machine(0:3)," having sixteen possible values of a state variable ma (shown in the figure as "MA"). This state machine and path specification will be used hereinbelow to illustrate methods of design exploration and partial path generation in accordance with preferred embodiments of the present invention. Three states (or sets of states) of the machine are shown: an intermediate set 42 in which ma=4, another intermediate set 44 in which ma=6, and a target set 46 in which ma=1. The corresponding path specification requires that machine 40 pass through a state in set 42 and then a state in set 44 before reaching target set 46. As noted above, the machine need not necessarily reach these states on consecutive cycles.

Figure 3:
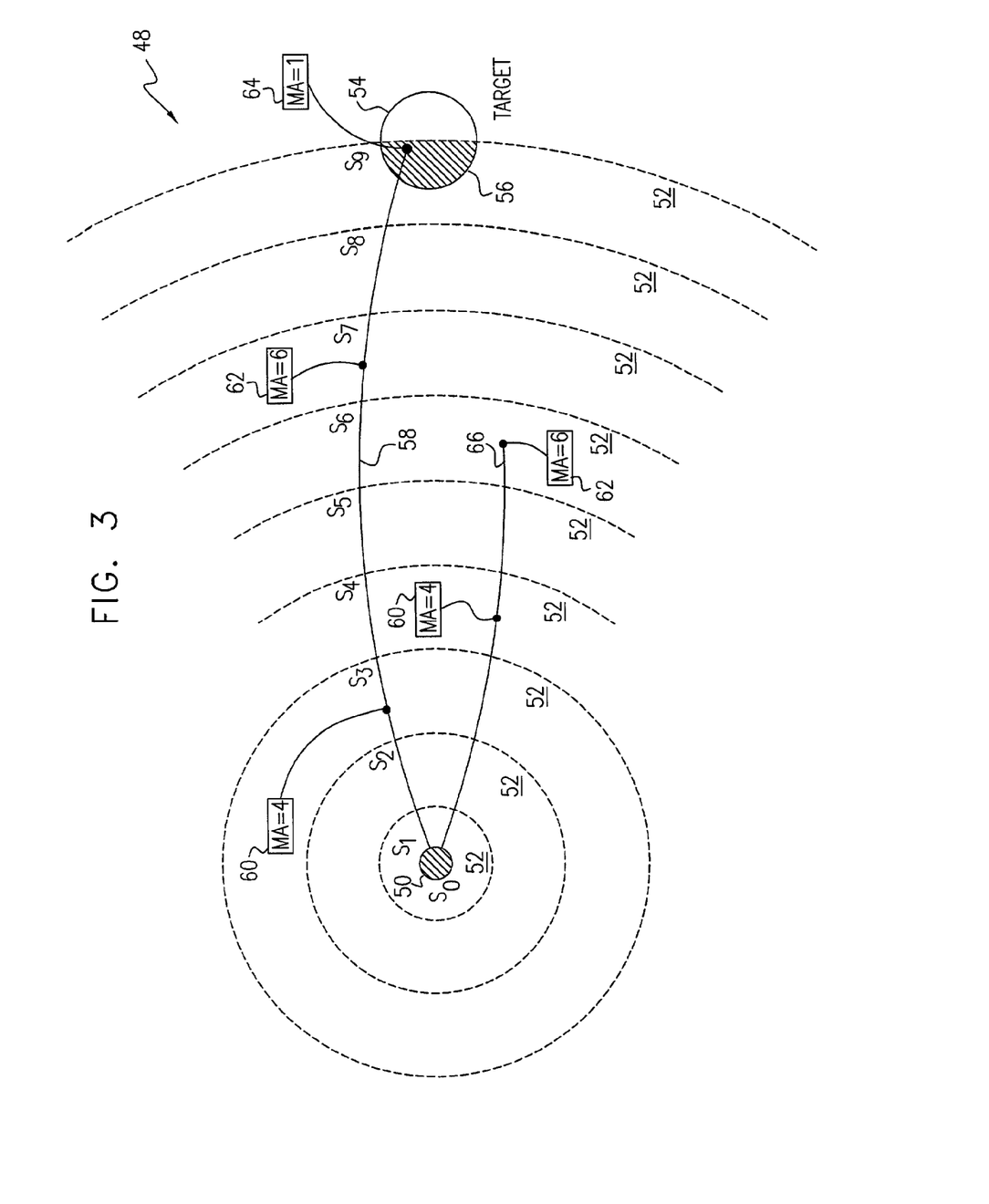
FIG. 3 is a schematic representation of a system state space, illustrating generation of a partial trace, in accordance with a preferred embodiment of the present invention.

FIG. 3 is a schematic representation of a state space 48 of machine 40, providing a conceptual view of a method for model checking with generation of partial traces, in accordance with a preferred embodiment of the present invention. The method is described in greater details below, with reference to FIG. 4, and a pseudocode implementation is listed in Table III. Design exploration begins from a set 50 of initial states, labeled $S_0$, which are typically specified by user 24. At the first iteration of the transition relation, processor 22 applies an image operation (using the nextStateImage() function at line 6 in Table I) to map $S_0$ into a set of states $S_1$. Subsequent iterations map each set $S_I$ into a successive set $S_{I+1}$. Referring back to Table I, at line 7, it is seen that states reached previously are removed from each succeeding set. These sets can thus be seen as a succession of concentric rings in state space, and are therefore referred to as "donuts" 52. The Ith donut is the set of states that can be reached in I cycles of the transition relation, but no less.

For simplicity, it is assumed here that all of the donuts are saved as the iterations through state space 48 proceed. When large numbers of states are involved, however, saving all these donuts can be excessively costly in terms of memory requirements. Therefore, in many cases it is preferable to save the donuts only intermittently (say one donut in every N successive donuts), and then to recompute the donuts subsequently when they are needed for finding counterexample traces. This method of memory conservation is described further in the above-mentioned patent application entitled "Time-Memory Tradeoff Control in Counterexample Production."

As each new donut 52 is computed, it is checked against the path specification to determine whether the next specified event along the path has been reached, i.e., in the case of the example shown in FIG. 2, whether the state variable ma for machine 40 has the next specified value in any of the states in the new donut. For this purpose, an automaton is created from the path specification, as described below, and is used to track the progress of the original model along the path. A Boolean condition corresponding to the expected state transition is evaluated against the state of the automaton to determine when the event has occurred. When the event occurs, the processor returns a message to user 24 at this point stating, for example, that "Event ma=4 was reached on cycle 3."

Generation of donuts 52 continues until processor 22 finds that there is a reachable path through state space 48 that satisfies the path specification and reaches a set 54 of target states (in which ma=1), or until it determines that no such path exists. For example, a path 58 in FIG. 3 is seen to reach an intersection region 56 between donut $S_9$ and set 54. Along the way, the path encounters a first event 60 when ma=4, a second event 62 when ma=6, and a final event 64 when ma=1 and the target state is reached. When the entire path specification is satisfied, processor 22 informs the user that a full trace exists. It generates a full counterexample (or witness) trace by working back through donuts 52, beginning from a selected state in intersection region 56. For each state in each donut along the way, the processor finds a predecessor state in the preceding donut, until it reaches one of the initial states in set 50.

It may sometimes occur, however, that the state space exploration terminates, with no new reachable states to find, before reaching target set 54. For example, a path 66 in FIG. 3 is seen to reach only events 60 and 62, and not final event 64. The processor accordingly informs user 24 that no full trace exists for the user's path specification.

In this case, processor 22 generates a partial trace showing a path up to the last event that it succeeded in reaching—in this case, event 62 (ma=6). The processor then works backward through donuts 52, beginning from a state that satisfied the last event, and finding predecessor states back through the preceding donuts to an initial state in set 50, as described above. It returns this partial trace to user 24, who will typically use the partial trace to understand how the model behaved and why it did not reach a state in target set 54. optionally, processor 22 generates and returns to the user multiple partial traces. Preferably, these traces are chosen to be as far as possible from one another in state space 48, as described in a U.S. patent application entitled, "Efficient Production of Disjoint Multiple Traces," filed on even date, which is assigned to the assignee of the present patent application, and whose disclosure is incorporated herein by reference.

Figure 4:
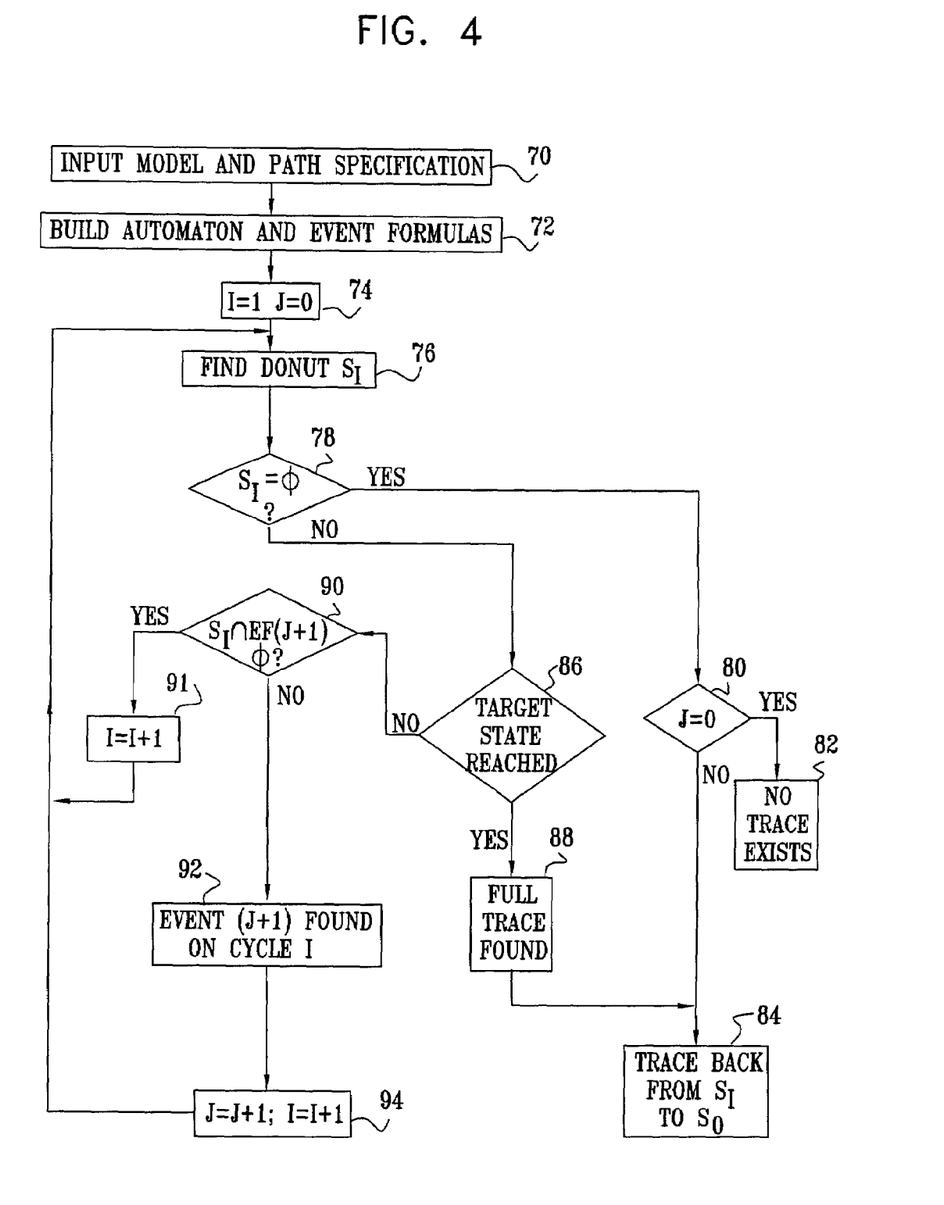
FIG. 4 is a flow chart that schematically illustrates a method for design exploration, in accordance with a preferred embodiment of the present invention.

FIG. 4 is a flow chart that schematically illustrates a method for on-the-fly model checking with partial trace generation, in accordance with a preferred embodiment of the present invention. The method is described here with reference to machine 40 shown in FIG. 2 and state space 48 illustrated in FIG. 3. The method begins with input by user 24 of model 26 and path specification 28, at an input step 70. Preferably, the path specification is translated into a temporal logic safety formula, as is known in the art.

Most preferably, a "sugar" formula is used, as described by Beer et al. in the above-mentioned article entitled "The Temporal Logic Sugar." For example, the path specification shown pictorially in FIG. 2 would be translated into the following sugar expression:

$$\{ma \neq 4[*], ma=4, ma \neq 6[*], ma=6, ma \neq 1[*], ma=1\}$$
$$(false) \tag{1}$$

This expression indicates that the machine must pass in sequence through states in which ma=4, 6, and 1, not necessarily in consecutive cycles. The machine may assume other states for an indeterminate number of cycles (as indicated by the notation "[*]") in between the states in the specified sequence. The suffix "false" indicates to the model checker that it must attempt to find a counterexample on which the path specification is true.

The sugar formula corresponding to the specification $\phi$ is used to build a non-deterministic automaton $A_\phi$ and an EF (p) type formula for model checking, at an automaton building step 72. The automaton is preferably created automatically, as described by Beer et al. in the above-mentioned article entitled "On-the-fly Model Checking of RCTL Formulas." Formally, the automaton $A_\phi$ is built so as to satisfy the condition that $$M \models \phi \phi M \times A_\phi \models EF(p_\phi) \tag{2}$$

wherein M is the model under test, and $p_\phi$ is the formula that defines the target states of the automaton.

For machine 40, as described by formula (1), the automaton generated at step 72 is listed below in Table II, written in the well-known SMV model checking language:

TABLE II

NON-DETERMINISTIC AUTOMATON

```
VAR aut:{0,1,2,3,4,5,6};
ASSIGN
    init(aut) :={1,2}
    next(aut) :=
    case
        aut=1 ^ ma≠4:{2,1};
        aut=2 ^ ma=4:{4,3};
        aut=3 ^ ma≠6:{4,3};
        aut=4 ^ ma=6:{6,5};
        aut=5 ^ ma≠1:{6,5};
        1:0;
    esac
```

The states of the above automaton (aut=1, 2, . . . , 6) correspond to the expected states and transitions of machine 40 along the path shown in FIG. 2, as expressed by formula (1). The automaton is built so that each move from one of its states to another is determined by a Boolean condition C, which is derived from the path specification of machine 40. The automaton begins in state aut=1 or aut=2 and advances to the next state at each cycle based on the current value of the variable ma. For example, in the second case in Table II, if aut=2 and ma=1, the automaton will be in either state 3 or state 4 in the next cycle. Automaton states 1, 3 and 5 have self-loops, indicating that the automaton may remain in each of these states until the next transition on the path of machine 40 is encountered. The $EF(p_\phi)$ formula that must be satisfied by the automaton is EF((aut=6)$\phi$(ma=1)). When aut=6 and ma=1, this final Boolean condition is satisfied, indicating that the automaton has reached a state in target set 54 (in the conceptual view of FIG. 3). The last case expression in Table II, "1:0", is invoked if none of the other conditions are satisfied. In this case, the automaton advances to state aut=0, which is used to trap all paths that do not conform to the path specification and can therefore be disregarded in the state space computation.

In the subsequent steps of the method of FIG. 4, the reachable state space of machine 40 is computed while at the same time imposing the logical conditions specified by the automaton of Table II. The use of the automaton automatically enforces the path specification that requires the machine to pass through intermediate states in sets 42 and 44 before reaching target set 46. The $EF(p_\phi)$ formula is verified on the fly, as described below, while computing the reachable state space of machine 40, subject to the automaton generated at step 72.

In addition to the full path formula $EF(p_\phi)$, additional event formulas are also generated at step 72. The event formulas are used in tracking the progress of the reachability analysis and in producing a partial trace in the event that no target state can be reached, as described below. For every state s of the automaton that does not have a self-loop, the event formula has the form $EF(s\phi C)$. Thus, the following event formulas are generated for states aut=2 and aut=4, respectively:

Event 1: $EF((aut=2)\phi(ma=4))$

Event 2: $EF((aut=4)\phi(ma=6))$

"Event 3" in this case is the path formula $EF((aut=6)\phi(ma=1))$ for the target state. The event formulas are verified on the fly, and effectively represent preconditions to satisfying the path formula.

Having generated the required automaton and event formulas, processor 22 initializes its reachability analysis of state space 48, at an initialization step 74. Here the index I tracks donuts 52 shown in FIG. 3, while J tracks the events that have been generated along the specified path. Each successive donut $S_I$ is found by the image operation described above, at a donut finding step 76. After computing the new reachable states in each iteration, the states found in the preceding iteration are subtracted out (line 7 in Table I above) to determine the new donut.

If the state space of the model is exhausted at some iteration without reaching a target state, the new donut will be found to be empty, at a search termination step 78. In this case, processor 22 checks to determine whether any of the specified event formulas have so far been satisfied, at an event index checking step 80. If none of the events has yet occurred, it means that the model did not reach even the first event on the specified path before the reachability analysis terminated. (In terms of the present example, this equivalently means that machine 40 has not reached a state in set 42, and therefore Event 1 has not been triggered.) In this case, processor 22 informs user 24 that no trace can be generated, at a non-tracing step 82.

On the other hand, if some or all of the events have been triggered (so that J>0), processor 22 computes a trace from the farthest point reached on the path back to one of the states in initial set 50, at a trace production step 84. The method for generating traces in this case was described above briefly with reference to FIG. 3 and is shown in pseudocode form in Table III below. It is described in greater detail in the related patent applications cited above, including "Time-Memory Tradeoff Control in Counterexample Production" and "Efficient Production of Disjoint Multiple Traces."

As long as the latest donut $S_I$ is not found to be empty at step 78, processor 22 checks whether the current donut intersects target set 54, at an intersection checking step 86. In terms of the automaton $A_\phi$, this step is carried out on the fly by determining whether the path formula $EF(p_\phi)$ has been satisfied. (This step will not be reached, however, until all the preceding events EF(J) have occurred.) At this point, the reachability analysis of state space 48 is complete. The processor indicates to user 24 that a full trace will be produced, at a full trace step 88. It then produces such a trace, at step 84, from a state in target set 46 back to initial set 50, corresponding to path 58 in FIG. 3.

If processor 22 determines that it has not reached the target set, it checks whether the next expected event on the specified path has been triggered, at an event checking step 90. This step is equivalent to determining whether the current donut $S_I$ intersects the space defined by the event formula EF(J+1). Until this event occurs, processor 22 continues to increment the donut index I, at a donut incrementation step 91, and returns to step 76 to construct the next donut.

When event J+1 is triggered, processor 22 informs the user that Event J+1 was encountered on cycle I of the reachability analysis, at a reporting step 92. Both the event index J and the donut index I are incremented in this case, at an event incrementation step 94, and the process continues to iterate at step 76.

The report provided at step 92 enables the user to keep track of the progress of the model checker and, possibly, to interrupt the search if a long time passes without completing the specified path. Upon interrupting the search, the user may ask processor 22 to provide a partial trace, showing how far along the specified path it has reached. In this case, a partial trace is generated, depending on the last event triggered, as illustrated by path 66, shown in FIG. 3. The user can then either abort or resume the search, as appropriate. The same sort of partial trace is generated at step 84 if the reachability analysis terminates after one or more of the events EF(J) have been triggered but before target set 54 has been reached.

Table III is a pseudocode listing corresponding to the method of FIG. 4, based on the automaton $A_\phi$ and the event formulas described above. The method in the listing assumes that donuts $S_i$ are represented in the form of binary decision diagrams (BDDs), as are known in the art. The theory of BDDs is described, for example, by Bryant, in "Graph-based Algorithms for Boolean Function Manipulation," *IEEE Transactions on Computers* C-35:8 (1986), which is incorporated herein by reference. The use of BDDs in on-the-fly model checking is described in the above-mentioned U.S. patent application entitled, "Efficient Production of Disjoint Multiple Traces." The term found is used initially in the listing below to indicate the BDD representing $p_\phi$. (Subsequently, found is used to indicate the BDD from which the trace termination state is chosen in order to produce the trace, whether the trace is complete or partial.) The terms $ef_j$ represent the BDDs of the event formulas, wherein the path specification comprises n such events.

TABLE III

MODEL CHECKING WITH PARTIAL TRACE GENERATION

1   reachable = new = initialStates;
2   i = 0; maxe = 0
3   while ((new ≠ ∅)&&(new ∩ found = ∅)) {
4      $S_i$ = new;
5      i = i+1;
6      next = nextStateImage(new);
7      new = next \ reachable;
8      reachable = reachable ∪ next;

TABLE III-continued

MODEL CHECKING WITH PARTIAL TRACE GENERATION

```
9       for (j = n downto maxe+1) do {
10          if (new ∩ ef_j ≠ ∅) {
11              maxe = j; donut = i;
12              print "Event "maxe" encountered on cycle
                    "donut""
13              break; (from 'for' loop)
14          }
15      }
16   if (new = ∅ && maxe = 0) {
17      print "No trace exists for this path";
18      return;
19   }
20   else if (new = ∅ && maxe > 0) {
21      print "No full trace exists, producing trace
                until event "maxe"";
22      found = ef_maxe; k = donut;
23   }
24   else {
25      k = i − 1;
26      print "Trace found on cycle k";
27   }
28   good = S_k ∩ found;
29   while (k ≧ 0) {
30      X_k = choose one state from good;
31      if (k > 0) good = pred (X_k) ∩ S_{k−1};
32      k = k−1;
33   }
34   print "Trace is:" X_0 . . . X_k;
```

As noted above, the process described in Table III above includes two main components: reachability analysis (lines 1–15) and trace production (lines 16–34). In the reachability analysis, donuts $\{S_0, S_1, \ldots, S_n\}$ are constructed using the function "nextStateImage(new)" to return the states that are reached in one cycle of the system transition relation beginning from the states in {new}. The trace of states $\{X_0 \ldots X_k\}$ is constructed using the function "pred($X_i$)" to find, for each state along the trace, a predecessor state in the preceding donut $S_{k-1}$ that would be mapped to the state by the nextStateImage function. The set of the predecessor states $X_0 \ldots X_k$ from one of the initial states to one of the target states constitutes a counterexample trace.

Although the sample computations described above are based on a particular type of path specification, the principles behind these computations may similarly be applied in model checking using logical formulas of other types. For example, any specification written in CTL, as well as a large subset of linear temporal logic (LTL) specifications, may be translated into a state machine with a formula of type AG(p) and then checked in this manner. As another example, the techniques of the present invention may be applied to specification formalisms in which the specification itself is a state machine. In all these cases, it is possible to define a path specification with respect to the states of the system under study, and to express the general logical formula in terms of specified conditions on the states through which the system must pass in order to fulfill or contradict the formula. An automaton is built embodying the path specification, as described by Beer et al. in "On-the-Fly Model Checking of RCTL Formulas," and is then used in the model checking process as described above.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for checking a model, which defines states of a hardware system under study and a transition relation among the states, the method comprising:

providing a specification of a path to be found through the states of the hardware system under study from an initial set that comprises at least one initial state among the states of the hardware system to a target set that comprises at least one target state among the states of the hardware system, such that a specified sequence of events is to occur on the path between the at least one initial state and the at least one target state;

beginning from the initial set, computing successive reachable sets comprising the states of the hardware system that are reachable from the initial set along the path, such that in the successive reachable sets the events occur in the specified sequence;

determining whether an intersection exists between one of the reachable sets on the path and the target set; and when the intersection is not found to exist, producing a partial trace along the path between the at least one initial state and a termination state in which at least one of the specified events occurs.

2. A method according to claim 1, wherein providing the specification of the path comprises defining the events in terms of transitions among the states of the hardware system under study.

3. A method according to claim 2, wherein defining the events comprises defining the transitions such that in the specified sequence of events, at least two consecutive transitions are separated by more than one cycle of the transition relation.

4. A method according to claim 2, wherein computing the successive reachable sets comprises building a non-deterministic automaton based on the transitions, and computing the reachable sets using the automaton.

5. A method according to claim 4, wherein building the non-deterministic automaton comprises defining Boolean conditions corresponding respectively to the transitions, and wherein occurrence of the events is detected by testing the Boolean conditions.

6. A method according to claim 1, wherein computing the successive reachable sets comprises detecting occurrence of the events in the specified sequence.

7. A method according to claim 6, and comprising informing a user upon detecting occurrence of the events.

8. A method according to claim 6, wherein producing the partial trace comprises choosing the termination state to be one of the states in which a final event occurs in the specified sequence of the events whose occurrence has been detected.

9. A method according to claim 1, wherein computing the successive reachable sets comprises:

determining a first set among the reachable sets, disjoint from the initial set, such that all of the states in the first set are reached from the at least one initial state in a first cycle of the transition relation; and determining the successive reachable sets, following the first set, such that all the states in each of the sets are reached from the states in a preceding set in a successive cycle of the transition relation, and so that each of the sets is disjoint from the initial set and from other sets determined before it.

10. A method according to claim 9, wherein producing the partial trace comprises selecting one of the states from each of at least some of the successive reachable sets.

11. A method according to claim 10, wherein selecting the one of the states comprises, for each of the states that is selected, choosing a predecessor state among the states in the preceding set until the state on the trace in the first set is found, and choosing, in the initial set, the predecessor state to the state in the first set.

12. A method according to claim 1, and comprising, when it is determined that the intersection exists between the target set and one of the reachable sets, producing a complete trace from the at least one target state through the states in the reachable sets to the at least one initial state.

13. A method according to claim 12, wherein producing the complete trace comprises computing the trace so that all the events occur along the trace in the specified sequence.

14. A method according to claim 1, wherein providing the specification of the path comprises specifying a property to be fulfilled by the at least one target state.

15. A method according to claim 14, wherein specifying the property comprises specifying a condition that is expected to be true over all of the reachable states of the hardware system under study, and wherein the condition is false in the at least one target state.

16. A method according to claim 14, wherein specifying the property comprises specifying a condition representing a desired behavior of the hardware system under study, such that the condition is fulfilled in the at least one target state.

17. A method according to claim 14, wherein computing the successive reachable sets comprises testing the property while computing the sets, and ceasing to compute the sets when the intersection is found to exist.

18. Model checking apparatus, comprising a model processor, which is arranged to receive a model that defines states of a hardware system under study and a transition relation among the states, and to receive a specification of a path to be found through the states of the hardware system under study from an initial set that comprises at least one initial state among the states of the hardware system to a target set that comprises at least one target state among the states of the hardware system, such that a specified sequence of events is to occur on the path between the at least one initial state and the at least one target state, the processor being further arranged to compute, beginning from the initial set, successive reachable sets comprising the states of the hardware system that are reachable from the initial set along the path, such that in the successive reachable sets the events occur in the specified sequence, and to determine whether an intersection exists between one of the reachable sets on the path and the target set, and when the intersection is not found to exist, to produce a partial trace along the path between the at least one initial state and a termination state in which at least one of the specified events occurs.

19. Apparatus according to claim 18, wherein the specification of the path comprises a definition of the events in terms of transitions among the states of the hardware system under study.

20. Apparatus according to claim 19, wherein the events are defined in terms of the transitions such that in the specified sequence of events, at least two consecutive transitions are separated by more than one cycle of the transition relation.

21. Apparatus according to claim 19, wherein the processor is arranged to build a non-deterministic automaton based on the transitions, and to compute the reachable sets using the automaton.

22. Apparatus according to claim 21, wherein the processor is arranged to determine Boolean conditions corresponding respectively to the transitions, and to detect occurrence of the events by testing the Boolean conditions.

23. Apparatus according to claim 18, wherein the processor is arranged to detect occurrence of the events in the specified sequence while computing the successive reachable sets.

24. Apparatus according to claim 23, wherein the processor is arranged to inform a user upon detecting occurrence of the events.

25. Apparatus according to claim 23, wherein to produce the partial trace, the processor is arranged to choose the termination state to be one of the states in which a final event occurs in the specified sequence of the events whose occurrence has been detected.

26. Apparatus according to claim 18, wherein the processor is arranged to compute the successive reachable sets by determining a first set among the reachable sets, disjoint from the initial set, such that all of the states in the first set are reached from the at least one initial state in a first cycle of the transition relation, followed by determining the successive reachable sets, following the first set, such that all the states in each of the sets are reached from the states in a preceding set in a successive cycle of the transition relation, and so that each of the sets is disjoint from the initial set and from other sets determined before it.

27. Apparatus according to claim 26, wherein the processor is arranged to produce the partial trace by selecting one of the states from each of at least some of the successive reachable sets.

28. Apparatus according to claim 27, wherein the processor is arranged to select the states from each of the at least some of the successive sets by choosing, for each of the states, a predecessor state among the states in the preceding set until the state on the trace in the first set is found, and choosing, in the initial set, the predecessor state to the state in the first set.

29. Apparatus according to claim 18, and wherein the processor is further arranged, upon determining that the intersection exists between the target set and one of the reachable sets, to produce a complete trace from the at least one target state through the states in the reachable sets to the at least one initial state.

30. Apparatus according to claim 29, wherein the processor is arranged to produce the complete trace so that all the events occur along the trace in the specified sequence.

31. Apparatus according to claim 18, wherein the specification of the path comprises a property to be fulfilled by the at least one target state.

32. Apparatus according to claim 31, wherein the property comprises a condition that is expected to be true over all of the reachable states of the hardware system under study, and wherein the condition is false in the at least one target state.

33. Apparatus according to claim 31, wherein the property comprises a condition representing a desired behavior of the hardware system under study, such that the condition is fulfilled in the at least one target state.

34. Apparatus according to claim 31, wherein the processor is arranged to test the property while computing the successive reachable sets, and to cease to compute the sets when the intersection is found to exist.

35. A computer software product, comprising a computer-readable medium in which program instructions are stored, which instructions, when read by a computer, cause the computer to receive a model that defines states of a hardware system under study and a transition relation among the states, and to receive a specification of a path to be found through the states of the hardware system under study from an initial set that comprises at least one initial state among the states of the hardware system to a target set that comprises at least one target state among the states of the hardware system, such that a specified sequence of events is to occur on the path between the at least one initial state and the at least one target state, and which cause the computer to compute, beginning from the initial set, successive reachable sets comprising the states of the hardware system that are reachable from the initial set along the path, such that in the successive reachable sets the events occur in the specified sequence, and to determine whether an intersection exists between one of the reachable sets on the path and the target set, and when the intersection is not found to exist, to produce a partial trace along the path between the at least one initial state and a termination state in which at least one of the specified events occurs.

36. A product according to claim 35, wherein the specification of the path comprises a definition of the events in terms of transitions among the states of the hardware system under study.

37. A product according to claim 36, wherein the events are defined in terms of the transitions such that in the specified sequence of events, at least two consecutive transitions are separated by more than one cycle of the transition relation.

38. A product according to claim 36, wherein the instructions cause the computer to build a non-deterministic automaton based on the transitions, and to compute the reachable sets using the automaton.

39. A product according to claim 38, wherein the instructions cause the computer to determine Boolean conditions corresponding respectively to the transitions, and to detect occurrence of the events by testing the Boolean conditions.

40. A product according to claim 35, wherein the instructions cause the computer to detect occurrence of the events in the specified sequence while computing the successive reachable sets.

41. A product according to claim 40, wherein the instructions cause the computer to inform a user upon detecting occurrence of the events.

42. A product according to claim 40, wherein the instructions cause the computer to produce the partial trace by choosing the termination state to be one of the states in which a final event occurs in the specified sequence of the events whose occurrence has been detected.

43. A product according to claim 35, wherein the instructions cause the computer to compute the successive reachable sets by determining a first set among the reachable sets, disjoint from the initial set, such that all of the states in the first set are reached from the at least one initial state in a first cycle of the transition relation, followed by determining the successive reachable sets, following the first set, such that all the states in each of the sets are reached from the states in a preceding set in a successive cycle of the transition relation, and so that each of the sets is disjoint from the initial set and from other sets determined before it.

44. A product according to claim 43, wherein the instructions cause the computer to produce the partial trace by selecting one of the states from each of at least some of the successive reachable sets.

45. A product according to claim 44, wherein the instructions cause the computer to select the states from each of the at least some of the successive sets by choosing, for each of the states, a predecessor state among the states in the preceding set until the state on the trace in the first set is found, and choosing, in the initial set, the predecessor state to the state in the first set.

46. A product according to claim 35, and wherein the instructions further cause the computer, upon determining that the intersection exists between the target set and one of the reachable sets, to produce a complete trace from the at least one target state through the states in the reachable sets to the at least one initial state.

47. A product according to claim 46, wherein the instructions cause the computer to produce the complete trace so that all the events occur along the trace in the specified sequence.

48. A product according to claim 35, wherein the specification of the path comprises a property to be fulfilled by the at least one target state.

49. A product according to claim 48, wherein the property comprises a condition that is expected to be true over all of the reachable states of the hardware system under study, and wherein the condition is false in the at least one target state.

50. A product according to claim 48, wherein the property comprises a condition representing a desired behavior of the hardware system under study, such that the condition is fulfilled in the at least one target state.

51. A product according to claim 48, wherein the instructions cause the computer to test the property while computing the successive reachable sets, and to cease to compute the sets when the intersection is found to exist.

\* \* \* \* \*